(12) United States Patent
Kuang et al.

(10) Patent No.: US 10,117,350 B2
(45) Date of Patent: Oct. 30, 2018

(54) BOARD ASSEMBLY, COMMUNICATIONS SYSTEM, EJECTOR LEVER, AND EJECTOR LEVER UNLOCKING METHOD

(71) Applicant: Huawei Technologies Co., Ltd., Shenzhen (CN)

(72) Inventors: Xiankun Kuang, Shenzhen (CN); Chunhua Chen, Shenzhen (CN); Yong Yao, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 456 days.

(21) Appl. No.: 14/980,545

(22) Filed: Dec. 28, 2015

(65) Prior Publication Data

US 2016/0120056 A1 Apr. 28, 2016

Related U.S. Application Data

(63) Continuation of application No. PCT/CN2014/084868, filed on Aug. 21, 2014.

(30) Foreign Application Priority Data

Feb. 17, 2014 (CN) .......................... 2014 1 0052963

(51) Int. Cl.
E05C 3/04 (2006.01)
H05K 7/14 (2006.01)
G06F 1/18 (2006.01)

(52) U.S. Cl.
CPC ........... *H05K 7/1417* (2013.01); *E05C 3/042* (2013.01); *G06F 1/186* (2013.01); *H05K 7/1409* (2013.01); *Y10T 403/595* (2015.01)

(58) Field of Classification Search
CPC . E05C 3/006; E05C 3/04; E05C 3/042; E05C 3/045; E05C 2005/005;

(Continued)

(56) References Cited

U.S. PATENT DOCUMENTS 4,365,831 A * 12/1982 Bourne .................. E05C 3/122
292/210
4,975,073 A * 12/1990 Weisman ............. H05K 7/1409
439/153

(Continued)

FOREIGN PATENT DOCUMENTS

CN 201142797 Y 10/2008
CN 101534620 A 9/2009

(Continued)

OTHER PUBLICATIONS

Partial English Translation and Abstract of Chinese Patent Application No. CN103841789, Nov. 13, 2015, 3 pages.

(Continued)

*Primary Examiner* — Josh Skroupa
(74) *Attorney, Agent, or Firm* — Conley Rose, P.C.

(57) ABSTRACT

An ejector lever includes a lever body and an unlocking mechanism, where the unlocking mechanism includes an unlocking hook and a safety latch, the unlocking hook is rotatably connected to the lever body using a first rotating shaft, and the safety latch is rotatably connected to the lever body using a second rotating shaft. The unlocking hook is provided with a first end and a second end, the first end is opposite to the second end across the first rotating shaft, the first end is provided with a hook, the second end is provided with a first abutting part, the safety latch is provided with a second abutting part, and the first abutting part is in contact with the second abutting part; and the second abutting part is configured to apply first force on the first abutting part when the safety latch rotates around the second rotating shaft.

11 Claims, 4 Drawing Sheets

(58) Field of Classification Search
CPC ....... G06F 1/185; G06F 1/186; H05K 7/1402; H05K 7/1405; H05K 7/1409; H05K 7/1417; Y10T 29/49826; Y10T 403/59; Y10T 403/591; Y10T 403/595; Y10T 403/599; Y10T 403/60; Y10T 403/602; Y10T 403/604; Y10T 403/608
USPC .......... 403/321, 322.1, 322.4, 325–328, 330, 403/DIG. 4; 439/160; 361/727, 747, 361/802, 803; 29/428
See application file for complete search history.

(56) References Cited

U.S. PATENT DOCUMENTS

| | | | | |
|---|---|---|---|---|
| 5,414,594 | A * | 5/1995 | Hristake | H05K 7/1409 361/754 |
| 6,058,016 | A | 5/2000 | Anderson et al. | |
| 6,203,076 | B1 * | 3/2001 | Wytcherley | E05B 7/00 292/197 |
| 7,297,008 | B2 * | 11/2007 | Griffin | H05K 7/1409 439/157 |
| 7,963,577 | B2 * | 6/2011 | Wolf | E05C 3/046 292/241 |
| 8,295,055 | B2 * | 10/2012 | Van Der Mee | H05K 7/1409 361/727 |
| 9,545,028 | B2 * | 1/2017 | Hoshino | H05K 7/1411 |
| 9,730,356 | B2 * | 8/2017 | Franz | H05K 7/1487 |
| 2007/0211422 | A1 | 9/2007 | Liu et al. | |
| 2013/0135801 | A1 | 5/2013 | Peng et al. | |

FOREIGN PATENT DOCUMENTS

| | | |
|---|---|---|
| CN | 201467604 U | 5/2010 |
| CN | 102298426 A | 12/2011 |
| CN | 103841789 A | 6/2014 |
| EP | 0587451 A1 | 10/1993 |
| JP | 2003179202 A | 6/2003 |

OTHER PUBLICATIONS

Foreign Communication From a Counterpart Application, Chinese Application No. 201410052963.6, Chinese Office Action dated Dec. 24, 2015, 5 pages.
Foreign Communication From a Counterpart Application, PCT Application No. PCT/CN2014/084868, English Translation of International Search Report dated Nov. 13, 2014, 2 pages.
Foreign Communication From a Counterpart Application, PCT Application No. PCT/CN2014/084868, English Translation of Written Opinion dated Nov. 13, 2014, 6 pages.
Foreign Communication From a Counterpart Application, European Application No. 14882577.1, European Office Action dated Apr. 18, 2017, 6 pages.
Foreign Communication From a Counterpart Application, European Application No. 14882577.1, Extended European Search Report dated Jun. 15, 2016, 8 pages.

* cited by examiner

BOARD ASSEMBLY, COMMUNICATIONS SYSTEM, EJECTOR LEVER, AND EJECTOR LEVER UNLOCKING METHOD

CROSS-REFERENCE TO RELATED APPLICATIONS

This application is a continuation of International Application No. PCT/CN2014/084868, filed on Aug. 21, 2014, which claims priority to Chinese Patent Application No. 201410052963.6, filed on Feb. 17, 2014, both of which are hereby incorporated by reference in their entireties.

TECHNICAL FIELD

The present disclosure relates to the field of communications technologies, and in particular, to a board assembly, a communications system, an ejector lever, and an ejector lever unlocking method.

BACKGROUND

Figure 1:
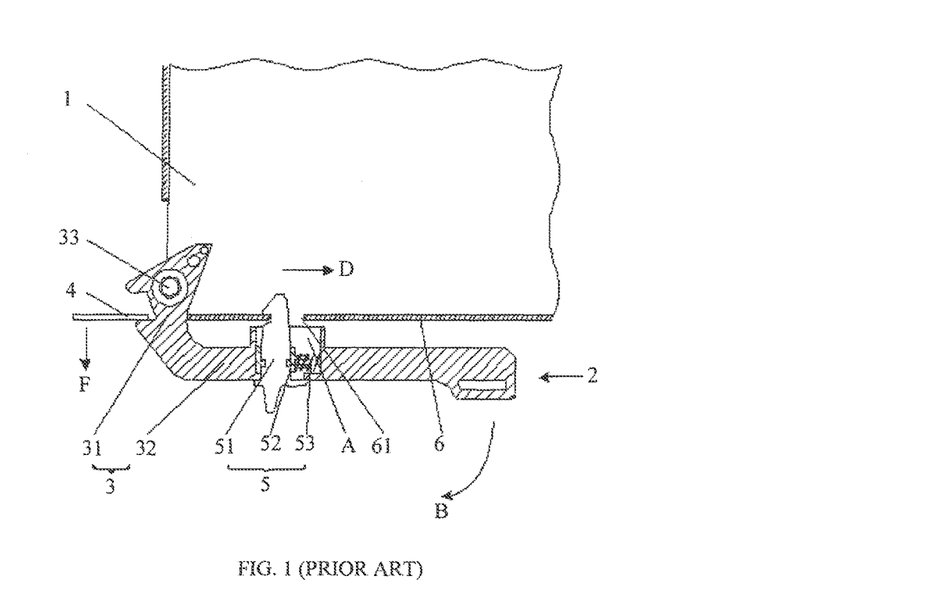
FIG. 1 is a schematic structural diagram of an ejector lever in the prior art.

Generally, on a communications device, multiple boards 1 shown in FIG. 1 are installed, and an ejector lever 2 is disposed on the board 1, and is configured to remove the board 1 from the communications device.

The ejector lever 2 includes a lever body 3, where the lever body 3 is provided with a head 31 and a rod-shaped arm 32, and the head 31 is rotatably connected to the board 1 using a rotating shaft 33, such that the ejector lever 2 can rotate around the rotating shaft 33. When the board needs to be removed, the arm 32 is pulled to enable the ejector lever 2 to rotate around the rotating shaft 33 along a direction B, such that the head 31 of the ejector lever 2 abuts against a frame 4 of the communications device. As the ejector lever 2 further rotates, the frame 4 applies reaction force F on the ejector lever 2, so as to enable the board 1 to be released from a board slot.

The ejector lever 2 further includes an unlocking mechanism 5, which is configured to, when the ejector lever 2 does not need to be used, lock the arm 32 on a panel 6 fixedly connected to the board 1, thereby preventing the ejector lever 2 from rotating around the rotating shaft 33.

The unlocking mechanism 5 is clamped inside a cavity A that is projected from the middle of the arm 32, and includes an unlocking hook 51, a sliding buckle 52, and a spring 53. The unlocking hook 51 is fastened to the sliding buckle 52, one end of the spring 53 abuts against one inner side wall of the cavity A, and the other end thereof abuts against the sliding buckle 52, so as to enable the sliding buckle 52 to be pressed against the other inner side wall of the cavity A under action of elastic force of the spring 53. The sliding buckle 52 can perform, inside the cavity A, rectilinear translational motion along a telescopic direction D of the spring 53, so as to perform rectilinear translational motion along the direction D together with the unlocking hook 51.

The unlocking hook 51 is provided with a first end and a second end opposite to each other. The two ends extend out of the cavity A; the first end provided with a hook passes through a hole 61 on the panel 6, and hooks the panel 6 under action of the elastic force of the spring 63, to enable a lower surface of the hook to be in contact with a surface of the panel 6. The second end of the unlocking hook 51 has an arched smooth surface.

When unlocking needs to be performed, a thumb pushes the second end of the unlocking hook 51 along a direction in which the spring 53 is compressed under force, to enable the first end of the unlocking hook 51 to be out of contact with the panel 6; then pulls the arm 32 along the direction B to enable the first end of the unlocking hook 51 to be released from the hole 61.

In a process of implementing unlocking, when the thumb pushes the unlocking hook 51 to move, the unlocking hook 51 performs rectilinear translational motion. Relatively large friction is generated between the lower surface of the hook at the first end of the unlocking hook 51 and the surface of the panel 6; as a result, a pushing process is relatively laborious, and it is relatively difficult to perform unlocking.

SUMMARY

The present disclosure provides a board assembly, a communications system, an ejector lever, and an ejector lever unlocking method, avoiding sliding friction between an unlocking hook and a panel in a conventional ejector lever unlocking process; therefore, it is easier to perform unlocking.

To achieve the foregoing objective, the present disclosure uses the following technical solutions.

According to a first aspect, the present disclosure provides an ejector lever, including a lever body and an unlocking mechanism, where the unlocking mechanism includes an unlocking hook and a safety latch, the unlocking hook is rotatably connected to the lever body using a first rotating shaft, and the safety latch is rotatably connected to the lever body using a second rotating shaft; the unlocking hook is provided with a first end and a second end, the first end is opposite to the second end across the first rotating shaft, the first end is provided with a hook, the second end is provided with a first abutting part, the safety latch is provided with a second abutting part, and the first abutting part is in contact with the second abutting part; and the second abutting part is configured to apply a first force on the first abutting part when the safety latch rotates around the second rotating shaft, so as to enable the unlocking hook to rotate around the first rotating shaft.

With reference to the first aspect, in a first implementation manner of the first aspect, the first abutting part is provided with multiple first teeth, the second abutting part is provided with multiple second teeth, and when the first abutting part is in contact with the second abutting part, the multiple first teeth mesh with the multiple second teeth.

With reference to the first aspect or the first implementation manner of the first aspect, in a second implementation manner of the first aspect, the unlocking mechanism further includes a spring, one end of the spring is connected to the lever body, the other end thereof is connected to the second end of the unlocking hook, and the spring is configured to apply, on the second end, a second force of which a direction is opposite to that of the first force.

With reference to the first aspect, the first implementation manner of the first aspect, or the second implementation manner of the first aspect, in a third implementation manner of the first aspect, the first rotating shaft is parallel to the second rotating shaft.

With reference to the first aspect or any one of the first to third implementation manners of the first aspect, in a fourth implementation manner of the first aspect, the lever body is provided with a head and an arm; and a cavity having openings at two ends is disposed on the arm, the first rotating shaft and the second rotating shaft are fixedly disposed inside the cavity, the first end and the hook of the unlocking hook extend out of an opening at one end of the cavity, the safety latch is provided with a trigger, and the trigger extends out of an opening at the other end of the cavity.

With reference to the first aspect or any one of the first to fourth implementation manners of the first aspect, in a fifth implementation manner of the first aspect, a limiting part used for limiting a rotation angle of the unlocking hook is disposed on the lever body.

According to a second aspect, the present disclosure provides a board assembly, including a board and a panel fixedly connected to the board, where a hole is disposed on the panel, and the board assembly further includes the foregoing ejector lever, where the lever body is provided with a head and an arm, and the head is rotatably connected to the board or the panel using a third rotating shaft; and when the ejector lever is locked on the panel, a first end, provided with a hook, of the unlocking hook passes through the hole on the panel, and the hook hooks the panel at an edge of the hole.

With reference to the second aspect, in a first implementation manner of the second aspect, there are two ejector levers, which are respectively disposed at two side edges, opposite to each other, of the panel.

According to a third aspect, the present disclosure provides a communications system, including a subrack and the foregoing board assembly, where a board of the board assembly is inserted into the subrack.

According to a fourth aspect, the present disclosure provides an ejector lever unlocking method, which is applied to the foregoing board assembly, where an ejector lever of the board assembly is locked on the panel, and the ejector lever unlocking method includes wrenching a safety latch to enable the safety latch to rotate around the second rotating shaft, where a second abutting part of the safety latch applies the first force on a first abutting part of the unlocking hook, so as to enable the unlocking hook to rotate around the first rotating shaft, to drive the hook at the first end of the unlocking hook to be out of contact with the panel at an edge of the hole; and pulling the arm of the lever body of the ejector lever to enable the lever body to rotate around the third rotating shaft, to drive the hook of the unlocking hook to be totally released from the hole.

According to the board assembly, the communications system, the ejector lever, and the ejector lever unlocking method that are provided in the present disclosure, when an ejector lever is being unlocked, a safety latch is wrenched to rotate; in a rotation process of the safety latch, an unlocking hook is driven to rotate, and rotation of the unlocking hook drives a hook to be directly released from a panel at an edge of a hole; the moment the unlocking hook rotates, the hook is no longer in contact with the panel, thereby avoiding sliding friction between the hook and the panel in a conventional ejector lever unlocking process; therefore, it is easier to unlock the ejector lever.

BRIEF DESCRIPTION OF DRAWINGS

To describe the technical solutions in the embodiments of the present disclosure or in the prior art more clearly, the following briefly introduces the accompanying drawings required for describing the embodiments or the prior art. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 2:
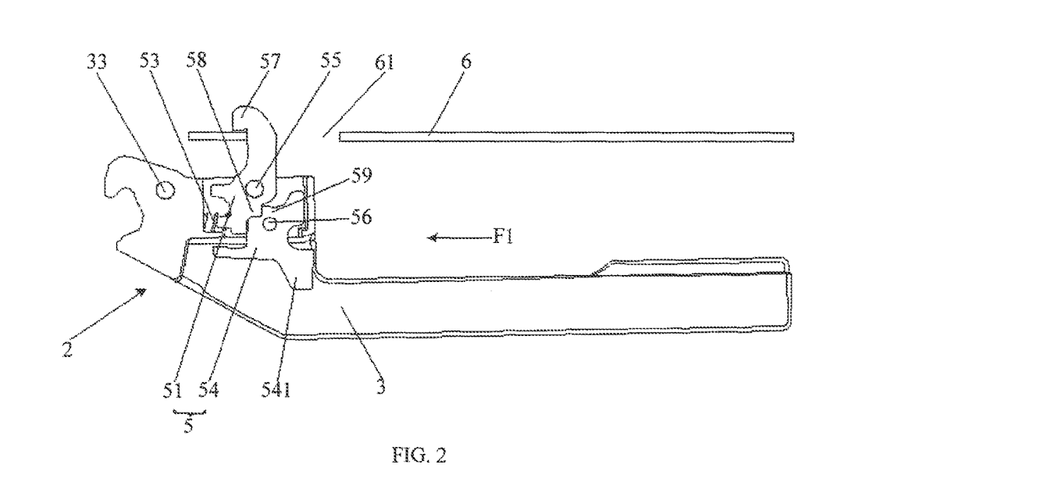
FIG. 2 is a schematic structural diagram of an ejector lever according to an embodiment of the present disclosure.
Figure 3:
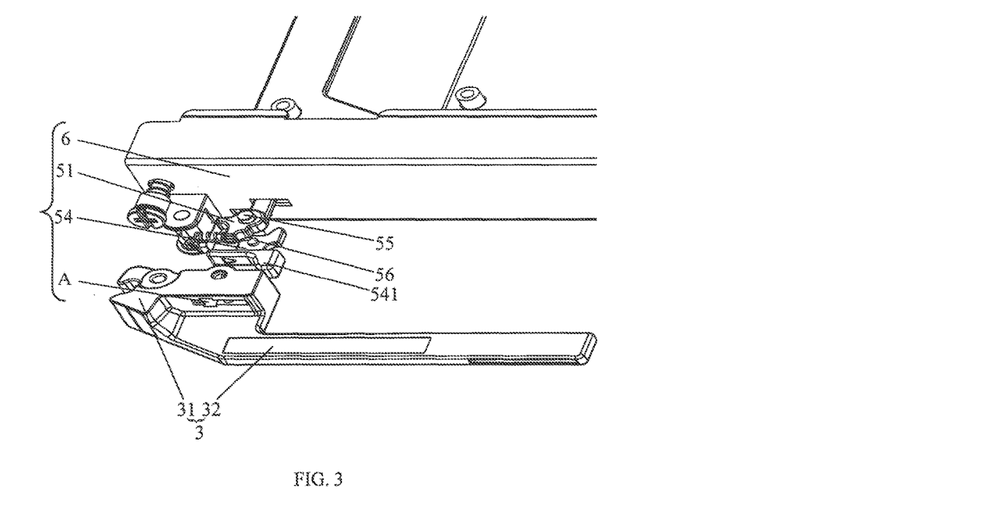
FIG. 3 is an exploded diagram of the ejector lever in FIG. 2.

As shown in FIG. 2 and FIG. 3, an embodiment of the present disclosure provides an ejector lever 2, including a lever body 3 and an unlocking mechanism 5, where the unlocking mechanism 5 includes an unlocking hook 51 and a safety latch 54, the unlocking hook 51 is rotatably connected to the lever body 3 using a first rotating shaft 55, and the safety latch 54 is rotatably connected to the lever body 3 using a second rotating shaft 56; the unlocking hook 51 is provided with a first end and a second end, the first end is opposite to the second end across the first rotating shaft 55, the first end is provided with a hook 57, the second end is provided with a first abutting part 58, the safety latch 54 is provided with a second abutting part 59, and the first abutting part 58 is in contact with the second abutting part 59; and the second abutting part 59 is configured to apply a first force F1 (in FIG. 2, a direction to which an arrow points is a direction of the first force F1) on the first abutting part 58 when the safety latch 54 rotates around the second rotating shaft 56, so as to enable the unlocking hook 51 to rotate around the first rotating shaft 55.

The foregoing ejector lever is applied to a board in a communications system. The board inserted into a subrack is removed using the ejector lever, and a side edge of the board is fixedly connected to a panel 6. The ejector lever 2 is rotatably connected to the board or the panel 6 using a third rotating shaft 33, where a hole 61 is disposed on the panel 6. Usually, the ejector lever 2 needs to be locked on the panel 6; in this case, the first end, provided with the hook 57, of the unlocking hook 51 passes through the hole 61 on the panel 6, and the hook 57 hooks the panel 6 at an edge of the hole 61; when unlocking is performed, as shown in FIG. 4, the safety latch 54 is wrenched to enable the safety latch 54 to rotate around the second rotating shaft 56 in a counterclockwise direction, and the second abutting part 59 of the safety latch 54 applies the first force F1 on the first abutting part 58 of the unlocking hook 51, so as to enable the unlocking hook 51 to rotate around the first rotating shaft 55 in a clockwise direction, to drive the hook 57 at the first end of the unlocking hook 51 to be out of contact with the panel 6 at the edge of the hole 61; as shown in FIG. 5, then an arm of the lever body 3 of the ejector lever 2 is pulled, such that the lever body 3 rotates around the third rotating shaft 33, to drive the hook 57 of the unlocking hook 51 to be totally released from the hole 61.

According to the ejector lever in this embodiment, a safety latch is wrenched to rotate; in a rotation process of the safety latch, an unlocking hook is driven to rotate, and rotation of the unlocking hook drives a hook to be directly released from a panel at an edge of a hole; the moment the unlocking hook rotates, the hook is no longer in contact with the panel, thereby avoiding sliding friction between the hook and the panel in a conventional ejector lever unlocking process; therefore, it is easier to unlock the ejector lever.

Figure 4:
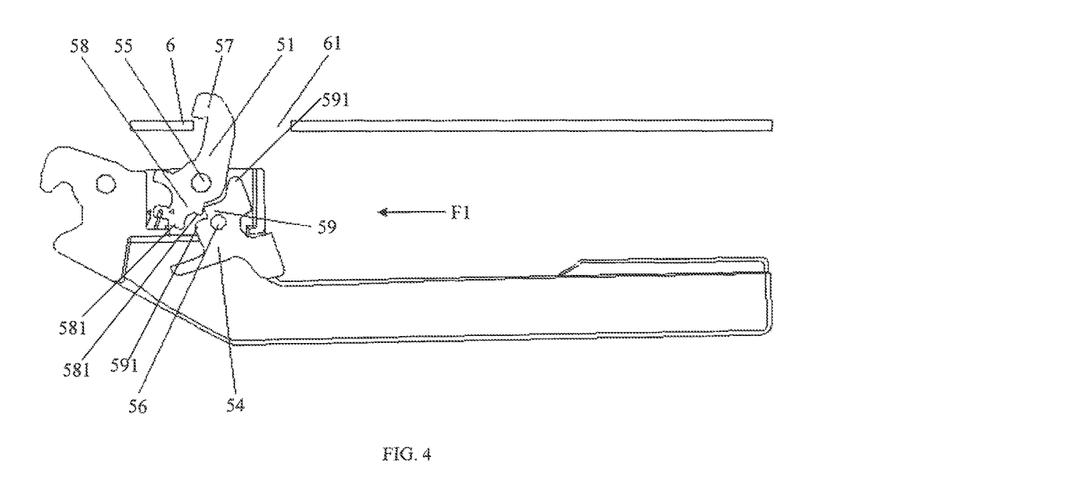
FIG. 4 is a schematic structural diagram of the ejector lever in FIG. 2 when being unlocked.
Figure 5:
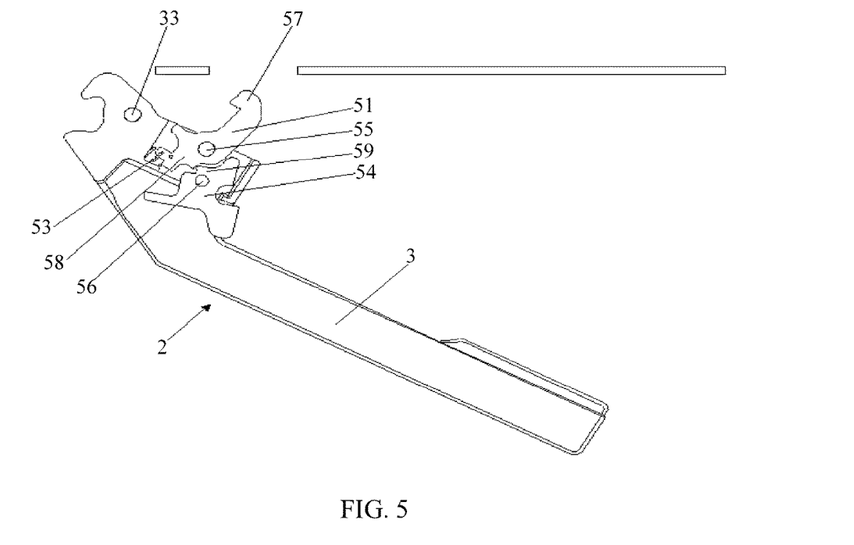
FIG. 5 is a schematic structural diagram of the ejector lever in FIG. 2 after being unlocked.

As shown in FIG. 4, the foregoing first abutting part 58 is provided with multiple first teeth 581, the foregoing second abutting part 59 is provided with multiple second teeth 591, and when the first abutting part 58 is in contact with the second abutting part 59, the foregoing multiple first teeth 581 mesh with the foregoing multiple second teeth 591.

The foregoing unlocking mechanism 5 may further include a spring 53, one end of the spring 53 is connected to the lever body 3, the other end thereof is connected to the second end of the unlocking hook 51, and the spring 53 is configured to apply, on the second end, a second force of which a direction is opposite to that of the first force. After the unlocking is completed, the safety latch 54 may be released; in this case, the second force applied by the spring 53 acts on the second end of the unlocking hook 51, such that the unlocking hook 51 rotates around the first rotating shaft 55 in a counterclockwise direction; at the same time, the first abutting part 58 of the unlocking hook 51 applies, on the second abutting part 59, force of which a direction is opposite to that of the first force F1, so as to enable the safety latch 54 to rotate around the second rotating shaft 56 in a clockwise direction; therefore, the unlocking hook 51 and the safety latch 54 are reset to states before the unlocking.

The first rotating shaft 55 may be parallel to the second rotating shaft 56, facilitating setting of the unlocking hook 51 and the safety latch 54. The first rotating shaft may also be not parallel to the second rotating shaft. For example, when the first rotating shaft is perpendicular to the second rotating shaft, meshing between the foregoing first teeth and the second teeth may also be implemented, where one part thereof drives, when rotating, another part thereof to rotate.

As shown in FIG. 2 and FIG. 3, the foregoing lever body 3 is provided with a head 31 and an arm 32; a cavity A having openings at two ends is disposed on the arm 32, the first rotating shaft 55 and the second rotating shaft 56 are fixedly disposed inside the cavity A, the first end and the hook 57 of the unlocking hook 51 extend out of an opening at one end of the cavity A, the safety latch 54 is provided with a trigger 541, and the trigger 541 extends out of an opening at the other end of the cavity A. The cavity A is configured to accommodate the unlocking hook 51 and the safety latch 54, such that the unlocking hook 51 and the safety latch 54 are separated from other parts and rotation of the unlocking hook 51 and the safety latch 54 is not affected.

A limiting part used for limiting a rotation angle of the unlocking hook 51 is disposed on the lever body 3. The rotation angle of the unlocking hook 51 is limited to be one that can enable the ejector lever to be unlocked. For example, as shown in FIG. 4, when rotating to a middle position of the hole 61, the unlocking hook 51 is limited by the limiting part and cannot continue to rotate. In this case, the hook 57 can be released from the hole 61 provided that the lever body 3 is pulled, which facilitates the unlocking, with no need to manually adjust an angle at which the safety latch is wrenched. The limiting part may be a protrusion disposed on the lever body 3, or may be an edge of the openings at the two ends of the cavity A. In addition, by means of structure setting of the unlocking hook 51 and the safety latch 54, when rotating, in a meshed state, to an angle, the unlocking hook 51 and the safety latch 54 are mutually stuck, and therefore rotation stops.

According to the ejector lever in this embodiment, a safety latch is wrenched to rotate; in a rotation process of the safety latch, an unlocking hook is driven to rotate, and rotation of the unlocking hook drives a hook to be directly released from a panel at an edge of a hole; the moment the unlocking hook rotates, the hook is no longer in contact with the panel, thereby avoiding sliding friction between the hook and the panel in a conventional ejector lever unlocking process; therefore, it is easier to unlock the ejector lever.

Figure 6:
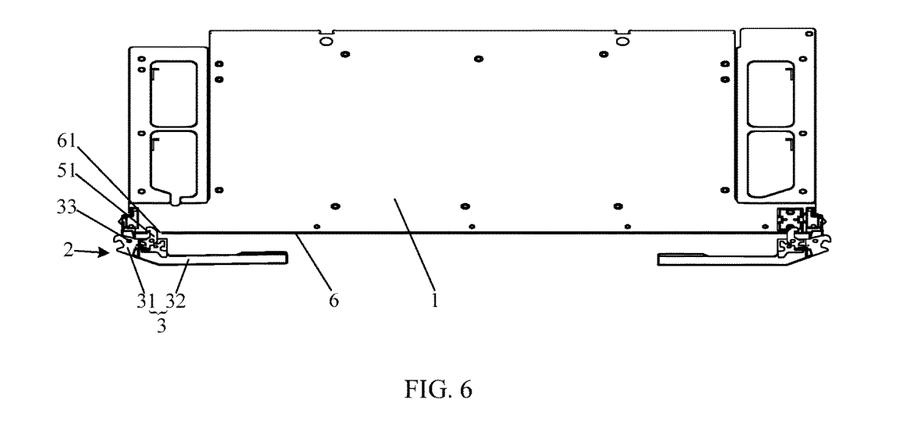
FIG. 6 is a schematic structural diagram of a board assembly according to an embodiment of the present disclosure.

As shown in FIG. 6, an embodiment of the present disclosure provides a board assembly, including a board 1 and a panel 6 fixedly connected to the board 1, where a hole 61 is disposed on the panel 6, and the board assembly further includes the foregoing ejector lever 2, where a lever body 3 is provided with a head 31 and an arm 32, and the head 31 is rotatably connected to the board 1 or the panel 6 using a third rotating shaft 33; and when the ejector lever 2 is locked on the panel 6, a first end, provided with a hook, of an unlocking hook 51 passes through the hole 61 on the panel 6, and the hook hooks the panel 6 at an edge of the hole 61.

There may be two ejector levers 2, which are respectively disposed at two side edges, opposite to each other, of the panel 6.

A structure and a principle of the ejector lever are the same as those in the foregoing embodiment, and are not described herein again.

According to the board assembly in this embodiment, when an ejector lever is being unlocked, a safety latch is wrenched to rotate; in a rotation process of the safety latch, an unlocking hook is driven to rotate, and rotation of the unlocking hook drives a hook to be directly released from a panel at an edge of a hole; the moment the unlocking hook rotates, the hook is no longer in contact with the panel, thereby avoiding sliding friction between the hook and the panel in a conventional ejector lever unlocking process; therefore, it is easier to unlock the ejector lever.

An embodiment of the present disclosure provides a communications system, including a subrack and the foregoing board assembly, where a board of the board assembly is inserted into the subrack.

As shown in FIG. 6, when a board 1 needs to be removed, an arm 32 of an ejector lever 2 is pulled to enable the ejector lever 2 to rotate around a rotating shaft 33 in a clockwise direction and to enable a head 31 of the ejector lever 2 to abut against a frame (not shown in FIG. 6) of a communications device. As the ejector lever 2 further rotates, the frame applies reaction force on the ejector lever 2, so as to enable the board 1 to be released from a board slot.

A structure and a principle of the board are the same as those in the foregoing embodiments, and are not described herein again.

According to the communications system in this embodiment, when an ejector lever is being unlocked, a safety latch is wrenched to rotate; in a rotation process of the safety latch, an unlocking hook is driven to rotate, and rotation of the unlocking hook drives a hook to be directly released from a panel at an edge of a hole; the moment the unlocking hook rotates, the hook is no longer in contact with the panel, thereby avoiding sliding friction between the hook and the panel in a conventional ejector lever unlocking process; therefore, it is easier to unlock the ejector lever.

Figure 7:
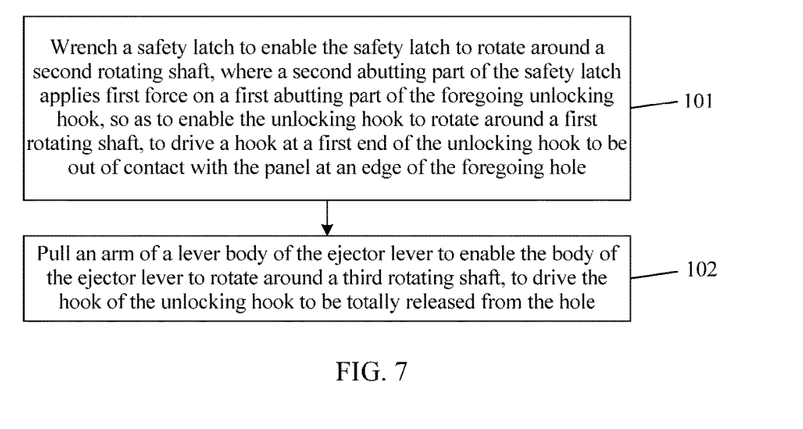
FIG. 7 is a flowchart of an ejector lever unlocking method according to an embodiment of the present disclosure.

As shown in FIG. 7, an embodiment of the present disclosure provides an ejector lever unlocking method, which is applied to the foregoing board assembly, where an ejector lever of the board assembly is locked on the panel, and the ejector lever unlocking method includes the following steps.

Step 101: Wrench a safety latch to enable the safety latch to rotate around a second rotating shaft, where a second abutting part of the safety latch applies a first force on a first abutting part of the foregoing unlocking hook, so as to enable the unlocking hook to rotate around a first rotating shaft, to drive a hook at a first end of the unlocking hook to be out of contact with the panel at an edge of the foregoing hole.

Step 102: Pull an arm of a lever body of the ejector lever to enable the body of the ejector lever to rotate around a third rotating shaft, to drive the hook of the unlocking hook to be totally released from the hole.

Structures and principles of the ejector lever and a board are the same as those in the foregoing embodiments, and are not described herein again.

According to the ejector lever unlocking method in this embodiment, when an ejector lever is being unlocked, a safety latch is wrenched to rotate; in a rotation process of the safety latch, an unlocking hook is driven to rotate, and rotation of the unlocking hook drives a hook to be directly released from a panel at an edge of a hole; the moment the unlocking hook rotates, the hook is no longer in contact with the panel, thereby avoiding sliding friction between the hook and the panel in a conventional ejector lever unlocking process; therefore, it is easier to unlock the ejector lever.

The foregoing descriptions are merely implementation manners of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. An ejector lever, comprising:
a lever body; and
an unlocking mechanism comprising an unlocking hook and a safety latch, the unlocking hook being rotatably coupled to the lever body using a first rotating shaft, the safety latch being rotatably coupled to the lever body using a second rotating shaft, the unlocking hook being provided with a first end and a second end, the first end being opposite to the second end across the first rotating shaft, the first end being provided with a hook, the second end being provided with a first abutting part, the safety latch being provided with a second abutting part, the first abutting part being in contact with the second abutting part, the second abutting part being configured to apply a first force on the first abutting part when the safety latch rotates around the second rotating shaft to enable the unlocking hook to rotate around the first rotating shaft, the first abutting part being provided with multiple first teeth, the second abutting part being provided with multiple second teeth, and the multiple first teeth meshing with the multiple second teeth when the first abutting part is in contact with the second abutting part.

2. The ejector lever of claim 1, wherein the unlocking mechanism further comprises a spring, one end of the spring being coupled to the lever body, the other end thereof being coupled to the second end of the unlocking hook, and the spring being configured to apply, on the second end of the unlocking hook, a second force of which a direction is opposite to that of the first force.

3. The ejector lever of claim 1, the first rotating shaft is parallel to the second rotating shaft.

4. The ejector lever of claim 1, wherein the lever body is provided with a head and an arm, a cavity having openings at two ends is disposed on the arm, the first rotating shaft and the second rotating shaft being fixedly disposed inside the cavity, the first end and the hook of the unlocking hook extending out of an opening at one end of the cavity, the safety latch being provided with a trigger, and the trigger extending out of an opening at the other end of the cavity.

5. A board assembly, comprising:
a board; and
a panel fixedly coupled to the board, a hole being disposed on the panel, the board assembly further comprising an ejector lever comprising a lever body and an unlocking mechanism, the unlocking mechanism comprising an unlocking hook and a safety latch, the unlocking hook being rotatably coupled to the lever body using a first rotating shaft, the safety latch being rotatably coupled to the lever body using a second rotating shaft, the unlocking hook being provided with a first end and a second end, the first end being opposite to the second end across the first rotating shaft, the first end being provided with a hook, the second end being provided with a first abutting part, the safety latch being provided with a second abutting part, the first abutting part being in contact with the second abutting part, the second abutting part being configured to apply a first force on the first abutting part when the safety latch rotates around the second rotating shaft to enable the unlocking hook to rotate around the first rotating shaft, the lever body being provided with a head and an arm, the head being rotatably coupled to the board or the panel using a third rotating shaft, when the ejector lever is locked on the panel, the first end, provided with the hook, of the unlocking hook passes through the hole on the panel, and the hook hooks the panel at an edge of the hole, the first abutting part being provided with multiple first teeth, the second abutting part being provided with multiple second teeth, and the multiple first teeth meshing with the multiple second teeth when the first abutting part is in contact with the second abutting part.

6. The board assembly of claim 5, wherein there are two ejector levers, which are respectively disposed at two side edges, opposite to each other, of the panel.

7. The board assembly of claim 5, wherein the unlocking mechanism further comprises a spring, one end of the spring being coupled to the lever body, the other end thereof being coupled to the second end of the unlocking hook, and the spring being configured to apply, on the second end of the unlocking hook, a second force of which a direction is opposite to that of the first force.

8. The board assembly of claim 5, wherein the first rotating shaft is parallel to the second rotating shaft.

9. The board assembly of claim 5, wherein a cavity having openings at two ends is disposed on the arm, the first rotating shaft and the second rotating shaft being fixedly disposed inside the cavity, the first end and the hook of the unlocking hook extending out of an opening at one end of the cavity, the safety latch being provided with a trigger, and the trigger extending out of an opening at the other end of the cavity.

10. An ejector lever, comprising:

a lever body comprising a head and an arm, a cavity having openings at two ends being disposed on the arm; and an unlocking mechanism comprising an unlocking hook and a safety latch, the unlocking hook being rotatably coupled to the lever body using a first rotating shaft, the safety latch being rotatably coupled to the lever body using a second rotating shah, the unlocking hook being provided with a first end and a second end, the first end being opposite to the second end across the first rotating shaft, the first end being provided with a hook, the second end being provided with a first abutting part, the safety latch being provided with a second abutting part, the first abutting part being in contact with the second abutting part, the second abutting part being configured to apply a first force on the first abutting part when the safety latch rotates around the second rotating shaft to enable the unlocking hook to rotate around the first rotating shaft, the first rotating shaft and the second rotating shaft being fixedly disposed inside the cavity, the first end and the hook of the unlocking hook extending out of an opening at one end of the cavity, the safety latch being provided with a trigger, and the trigger extending out of an opening at the other end of the cavity.

11. A board assembly, comprising:

a board; and a panel fixedly coupled to the board, a hole being disposed on the panel, the board assembly further comprising an ejector lever comprising a lever body and an unlocking mechanism, the unlocking mechanism comprising an unlocking hook and a safety latch, the unlocking hook being rotatably coupled to the lever body using a first rotating shaft, the safety latch being rotatably coupled to the lever body using a second rotating shaft, the unlocking hook being provided with a first end and a second end, the first end being opposite to the second end across the first rotating shaft, the first end being provided with a hook, the second end being provided with a first abutting part, the safety latch being provided with a second abutting part, the first abutting part being in contact with the second abutting part, the second abutting part being configured to apply a first force on the first abutting part when the safety latch rotates around the second rotating shaft to enable the unlocking hook to rotate around the first rotating shaft, the lever body being provided with a head and an arm, the head being rotatably coupled to the board or the panel using a third rotating shaft, when the ejector lever is locked on the panel, the first end, provided with the hook, of the unlocking hook passes through the hole on the panel, and the hook hooks the panel at an edge of the hole, a cavity having openings at two ends being disposed on the arm, the first rotating shaft and the second rotating shaft being fixedly disposed inside the cavity, the first end and the hook of the unlocking hook extending out of an opening at one end of the cavity, the safety latch being provided with a trigger, and the trigger extending out of an opening at the other end of the cavity.

* * * * *

UNITED STATES PATENT AND TRADEMARK OFFICE
CERTIFICATE OF CORRECTION

PATENT NO. : 10,117,350 B2  
APPLICATION NO. : 14/980545  
DATED : October 30, 2018  
INVENTOR(S) : Xiankun Kuang, Chunhua Chen and Yong Yao Page 1 of 1

It is certified that error appears in the above-identified patent and that said Letters Patent is hereby corrected as shown below:

On the Title Page

Item (30), Line 1: "201410052963" should read "201410052963.6"

In the Claims

Column 8, Line 5: insert --wherein-- after "claim 1,"

Column 9, Line 9: "shah" should read "shaft"

Signed and Sealed this  
First Day of January, 2019

Andrei Iancu  
*Director of the United States Patent and Trademark Office*